(12) United States Patent
DePaulis

(10) Patent No.: US 6,689,628 B1
(45) Date of Patent: Feb. 10, 2004

(54) METHOD FOR DENSE PIXEL FABRICATION

(75) Inventor: Lawrence F. DePaulis, New Haven, CT (US)

(73) Assignee: Bae Systems Information and Electronic Systems Integration Inc., Nashua, NH (US)

(*) Notice: Subject to any disclaimer, the term of this patent is extended or adjusted under 35 U.S.C. 154(b) by 0 days.

(21) Appl. No.: 10/219,862

(22) Filed: Aug. 15, 2002

(51) Int. Cl.$^7$ ................................................ H01L 21/66
(52) U.S. Cl. ............................ 438/24; 438/34; 438/613
(58) Field of Search .............................. 438/22–47, 613

(56) References Cited

U.S. PATENT DOCUMENTS

| | | |
|---|---|---|
| 5,488,504 A | 1/1996 | Worchesky et al. |
| 5,760,398 A | 6/1998 | Blackwell et al. |
| 6,030,700 A | * 2/2000 | Forrest et al. ............... 428/336 |
| 6,157,042 A | 12/2000 | Dodd |
| 6,201,242 B1 | 3/2001 | Eden et al. |

* cited by examiner

*Primary Examiner*—Jey Tsai
(74) *Attorney, Agent, or Firm*—Daniel J. Long

(57) ABSTRACT

A method of fabricating a dense pixel array comprising the steps of: (a) printing a photoresist mask and applying said mask to a semiconductor material substrate to form a masked area and an unmasked area on said substrate; (b) applying a photoresist material layer to the unmasked area of the substrate, then applying a metal layer over the photoresist material layer and the substrate, and then applying a solvent to remove the photoresist material layer and said metal layer applied over said photoresist material layer to leave a plurality of metal layers superimposed over the unmasked area of the substrate; (c) removing the substrate to a depressed substrate surface between the metal layers formed in step (b) to form a plurality of pixels each having an upper metal layer; (d) superimposing an insulative layer over each of the metal layers formed in step (c); (e) forming a hole in at least one of the insulative layers formed in step (d) so as to expose the metal layer under the insulative layer; and (f) superimposing a metallic feature over the insulative layers on a plurality of the pixels and electrically connecting said metallic feature to one of the metal layers superimposed over one of said pixels over which the metallic feature is superimposed.

12 Claims, 5 Drawing Sheets

METHOD FOR DENSE PIXEL FABRICATION

BACKGROUND OF THE INVENTION

1. Field of the Invention.

The present invention relates to optical systems and more particularly to optical modulators having a semiconductor material in the modulating structure.

2. Brief Description of Prior Developments.

Much work has been done recently on a wide range of opto-electronic devices based on the electric-field dependence of strong absorption resonances in semiconductor quantum wells (QWs). These devices typically manipulate light having photon energies near the bandgaps of the quantum wells, corresponding to wavelengths around 1000 nanometers (nm) for gallium arsenide (GaAs) and low-indium-concentration InGaAs.

In a QW, a layer of one semiconductor material is sandwiched between cladding layers of a different material, with the electronic properties of the materials being such that an electric potential well (in the central layer) is formed between two electric potential barriers (in the cladding layers). The QW's small thickness, on the order of 100 angstroms, results in a quantization of charge-carrier motion in the thickness direction that leads to a formation of electron and hold sub-bands in the conduction and valence bands, respectively.

The efficiency of such opto-electronic devices may be increased by increasing the number of addressable pixels on the semiconductor material. There is, therefore, a need for a fabrication technique that increases the number of available addressable pixels by requiring a smaller contact and the indium bumps used to address the pixels.

SUMMARY OF THE INVENTION

The present invention is a method of fabricating a dense pixel array. First, pixel size is defined by printing a photoresist mask and applying this mask to a semiconductor material substrate to form a mask area and an unmask area on the substrate. Then a photoresist material layer is applied to the unmasked area of the substrate. A metal layer is applied over the photoresist layer and substrate. A solvent is then applied to remove the photoresist material layer and the metal layer applied over the photoresist material resist layer. A plurality of metal layers are then superimposed over the unmasked area of the substrate is then left. The substrate is then removed of a depressed substrate surface between the metal layers to form a plurality of pixels each having an upper metal layer. An insulative layer is then superimposed over each of the metal layers. A hole is then formed in at least one of the insulative layers so as to expose the metal layer under the insulative layer. A metal feature is then superimposed over the insulative layers on the pixels and is electrically connected to metal feature of the metal layers super imposed over one of the pixels over which the metallic feature is superimposed.

Also encompassed within the present invention is an opto-electronic device which includes a base semiconductor substrate. A plurality of semiconductor pixels extend upwardly from the base semiconductor substrate and each of these pixels has an upper metallic layer. An insulative layer is superimposed over the upper metallic layers on the pixels. A metallic feature is superimposed over at least two of the pixels. A via hole extends through the insulated layer to expose one of these metallic features. A conductive material connects these metallic features and the upper metallic layer exposed by the via hole.

BRIEF DESCRIPTION OF THE DRAWINGS

The present invention further described with reference to the accompanying drawings in which:

FIG. 4b is a vertical cross-sectional view through 4b—4b in FIG. 4a;

FIG. 5b is a vertical cross-sectional view through 5b—5b in FIG. 5a;

FIG. 6b is a vertical cross-sectional view through 6b—6b in FIG. 6a.

DETAILED DESCRIPTION OF THE PREFERRED EMBODIMENT

Figure 1A:
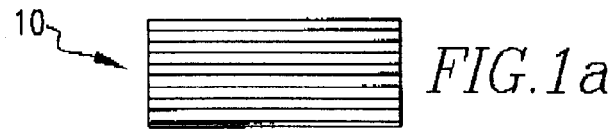
FIGS. 1a, 1b, 1c and 1d are plan views of photoresist masks used for different sized pixels, which are used to illustrate the first step in the method of the present invention.
Figure 1B:
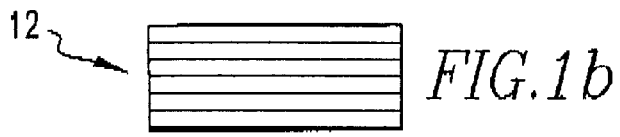
Figure 1C:
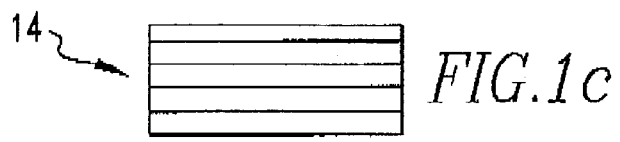
Figure 1D:
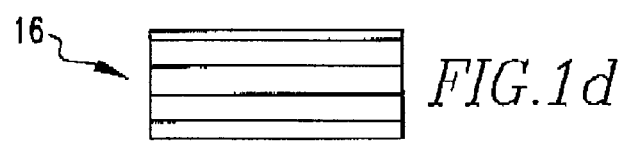

Referring to FIGS. 1a–1d, a photoresist mask is first produced in one of a variety of sizes by conventional electron-beam lithography. In FIG. 1a, for example, a photoresist mask is produced for manufacturing a 1.5 micron pixel/0.115 micron separation pixel array on a single wafer. In FIG. 1b a mask is shown to produce a 3.25 micron pixel/0.25 micron separation pixel array on a wafer. In FIG. 1c a photoresist mask 14 is shown. This photoresist mask produces a 6.5 micron pixel/0.5 micron separation pixel array on a wafer. On FIG. 1d a photoresist mask 16 is produced. This photoresist mask is used to manufacture 9.75 micron pixel/0.75 micron separation pixel array on a wafer.

Figure 2:
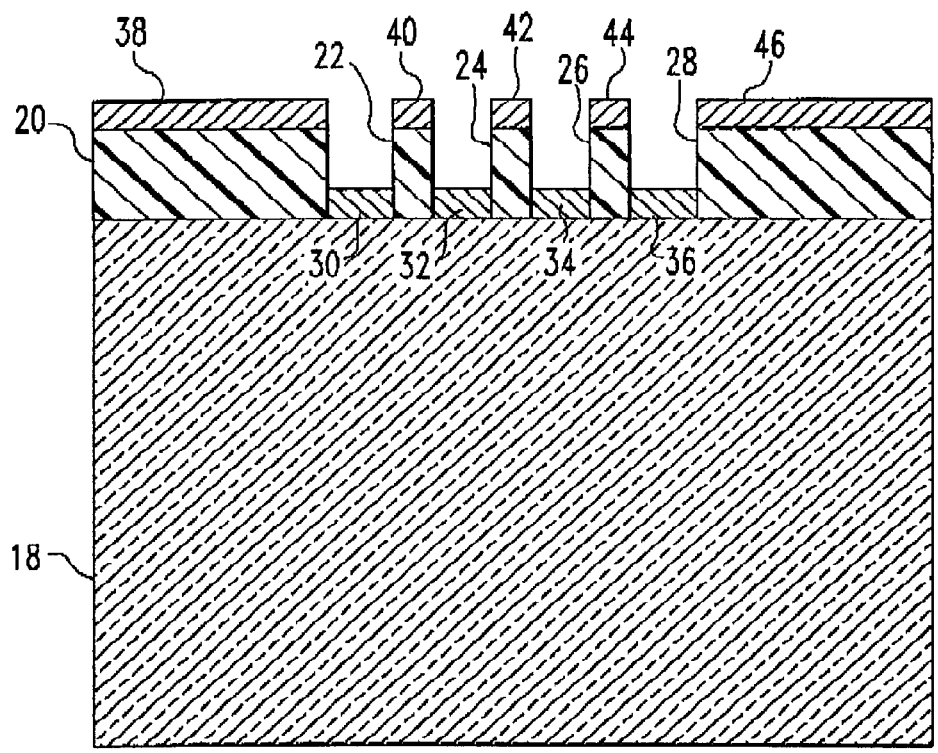
FIG. 2 is a vertical cross-sectional view of the substrate with metal in photoresist layers which is used to illustrate the second step in the method of the present invention.

Referring to FIG. 2, the second step of the method of the present invention is shown in which on a substrate 18 photoresist layers 20, 22, 24, 26 and 28 are applied. Between these photoresist layers there are spaces 30, 32, 34 and 36. Metal layers 38, 40, 42, 44 and 46 are then applied respectively over photoresist layers 20, 22, 24, 26 and 28. A solvent is then applied to remove the photoresist material layers 20, 22, 24, 26 and 28 as well as the metal layers 38, 40, 42, 44 and 46 applied over photoresist material layers 20, 22, 24, 26 and 28

Figure 3:
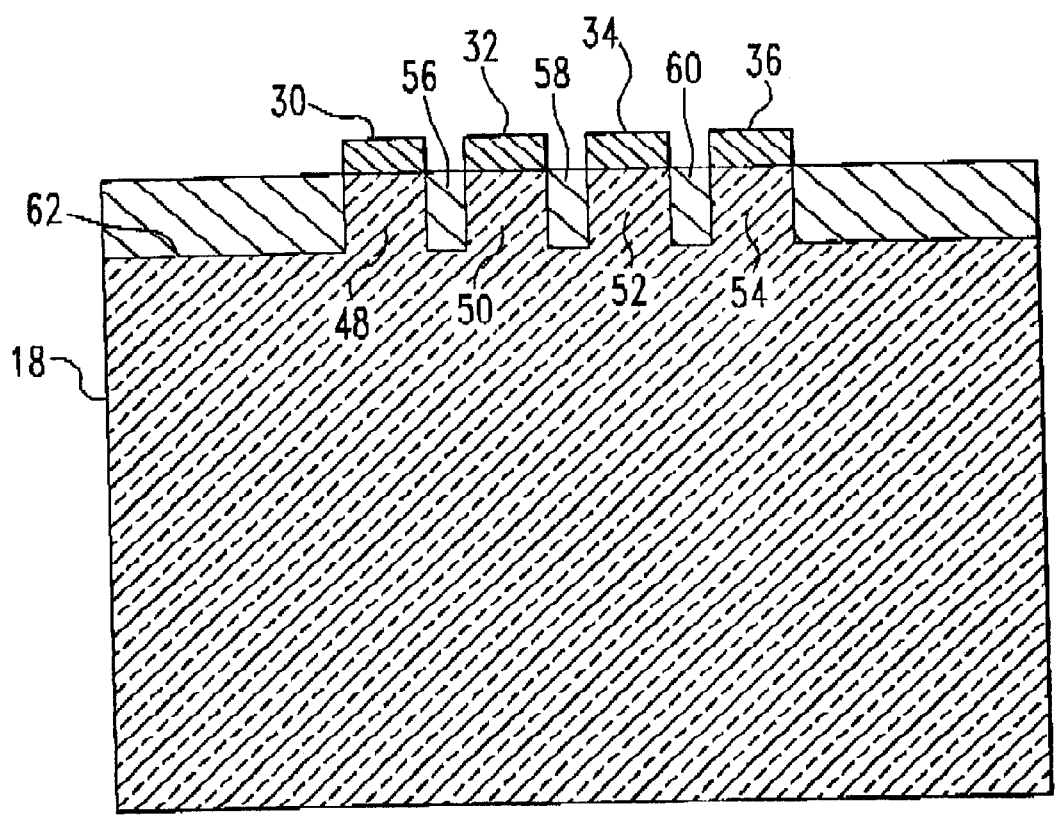
FIG. 3 is a vertical cross-sectional view of the substrate shown in FIG. 2 with a metal layer after further processing which is used to illustrate the third step in the method of the present invention.

Referring to FIG. 3, the remaining metal layers 30, 32, 34 and 36 are superimposed over pixels 48, 50, 52 and 54 which extend upwardly from substrate 18. Separation spaces 56, 58 and 60 are defined respectively between pixels 48 and 50, 50 and 52, and 52 and 54. A base surface 62 is also formed from where the pixels extend upwardly from the substrate 18.

Figure 4A:
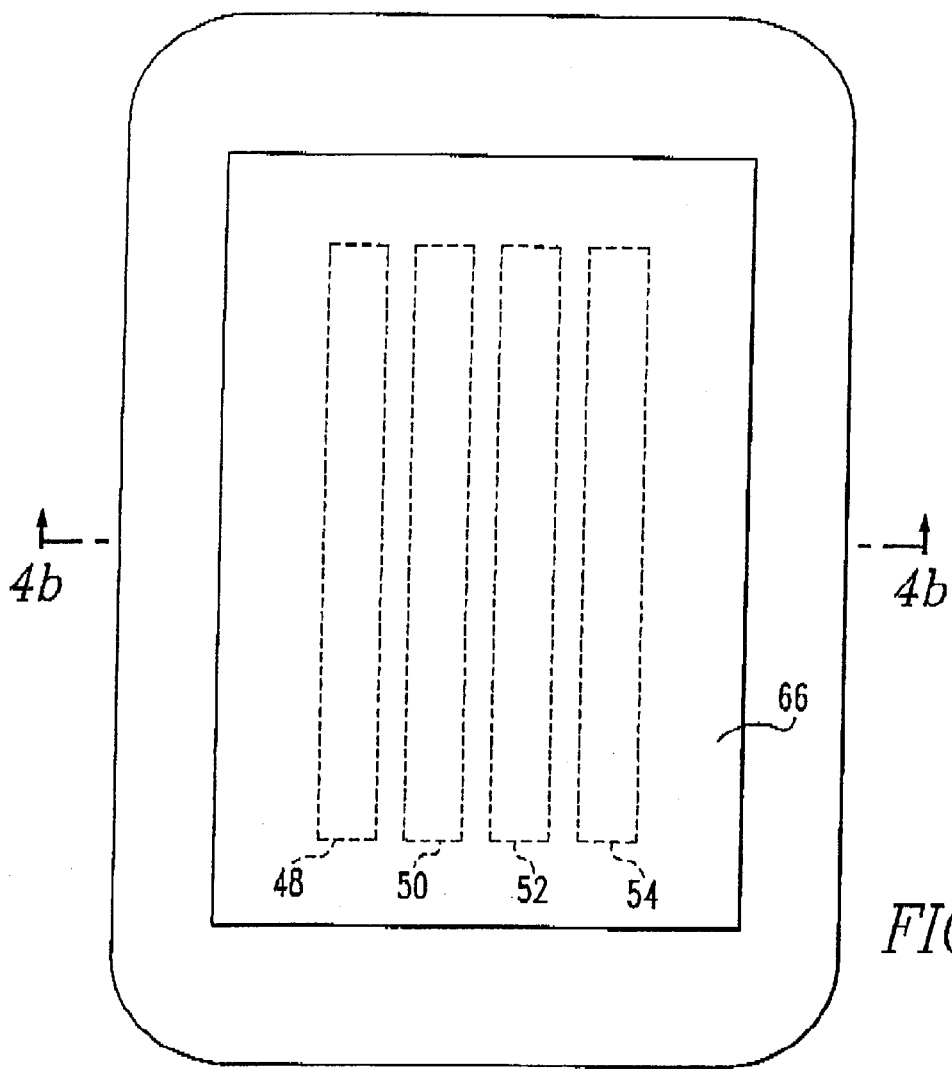
FIG. 4a is a top plan view of the substrate with metal and nitride layers shown in FIG. 3 after further processing.
Figure 4B:
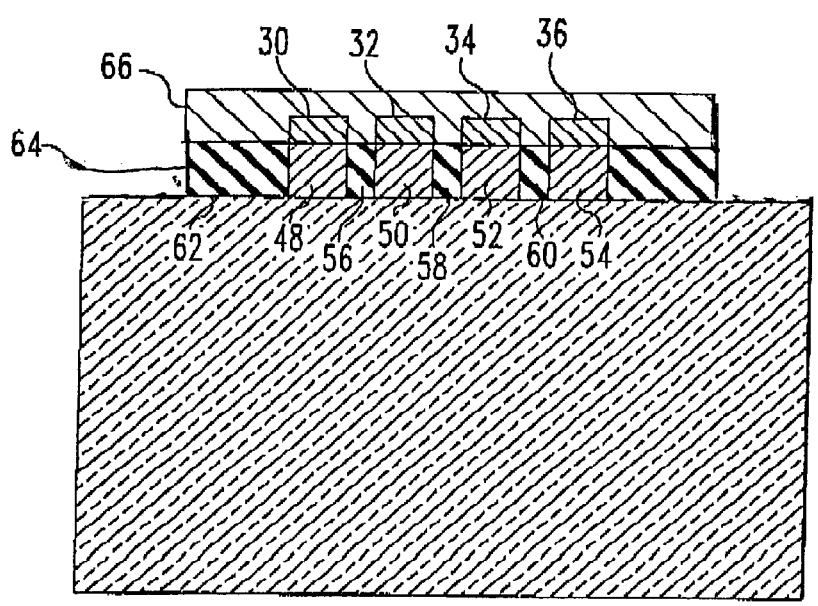

Referring to FIGS. 4a and 4b, an insulative layer is formed over each of the metal layers formed in the previous step. In particular a lower nitride layer 64 is deposited up to the base of the metal layer 30, 32, 34 and 36. Thereafter an upper nitride layer 66 is superimposed over the lower nitride layer 64 and the metal layers 30, 32, 34 and 36.

Figure 5A:
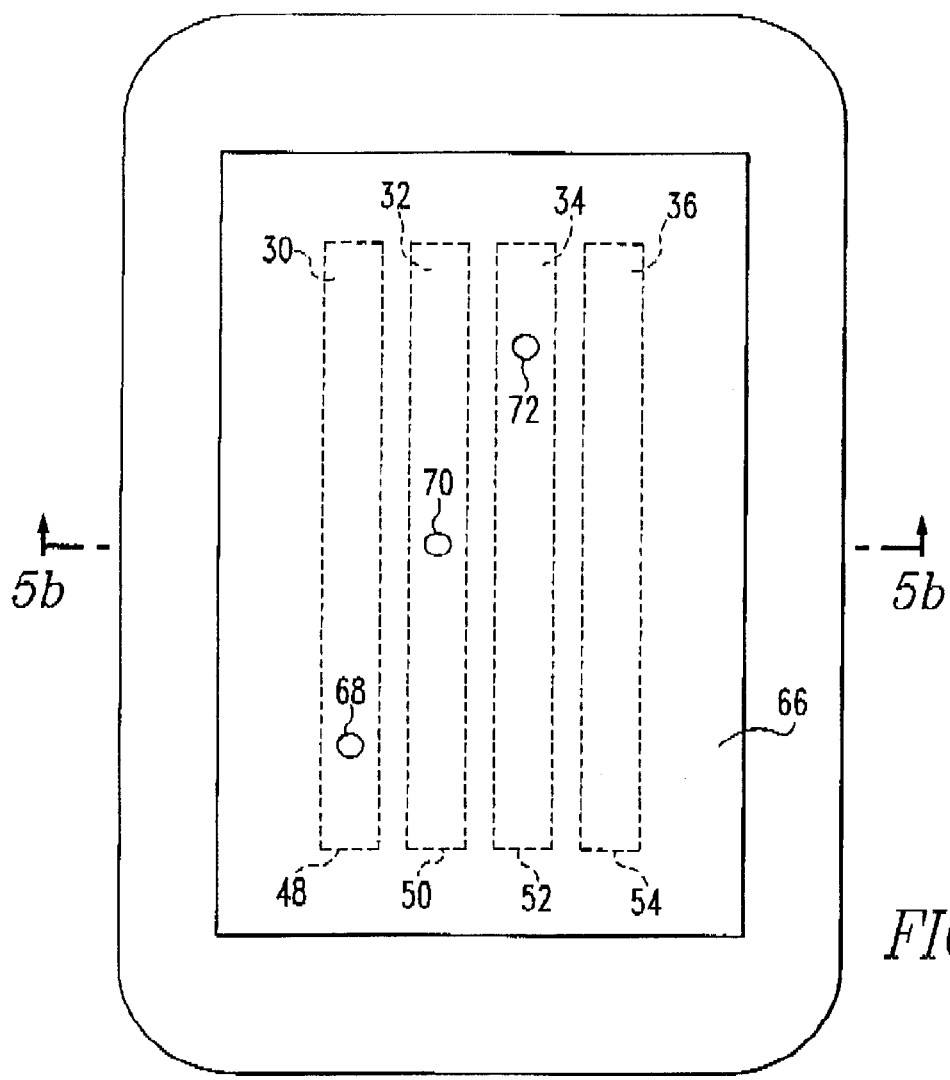
FIG. 5a is a top plan view of the substrate with metal and nitride layers shown in FIG. 4a and 4b after further processing.
Figure 5B:
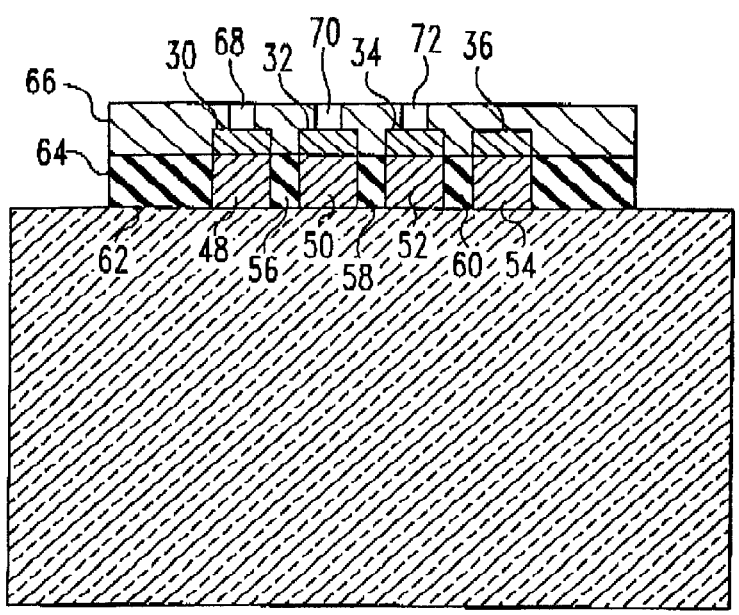

Referring to FIGS. 5*a* and 5*b*, a via hole 68 is formed in upper nitride layer 66 to expose metal surface 30. Similarly via hole 70 (FIG. 5*b*) is formed in nitride layer 66 to expose metal layer 32 on pixel 50. In the same way via hole 72 is formed in nitride layer 66 to expose metal layer 34 on pixel 52.

Figure 6A:
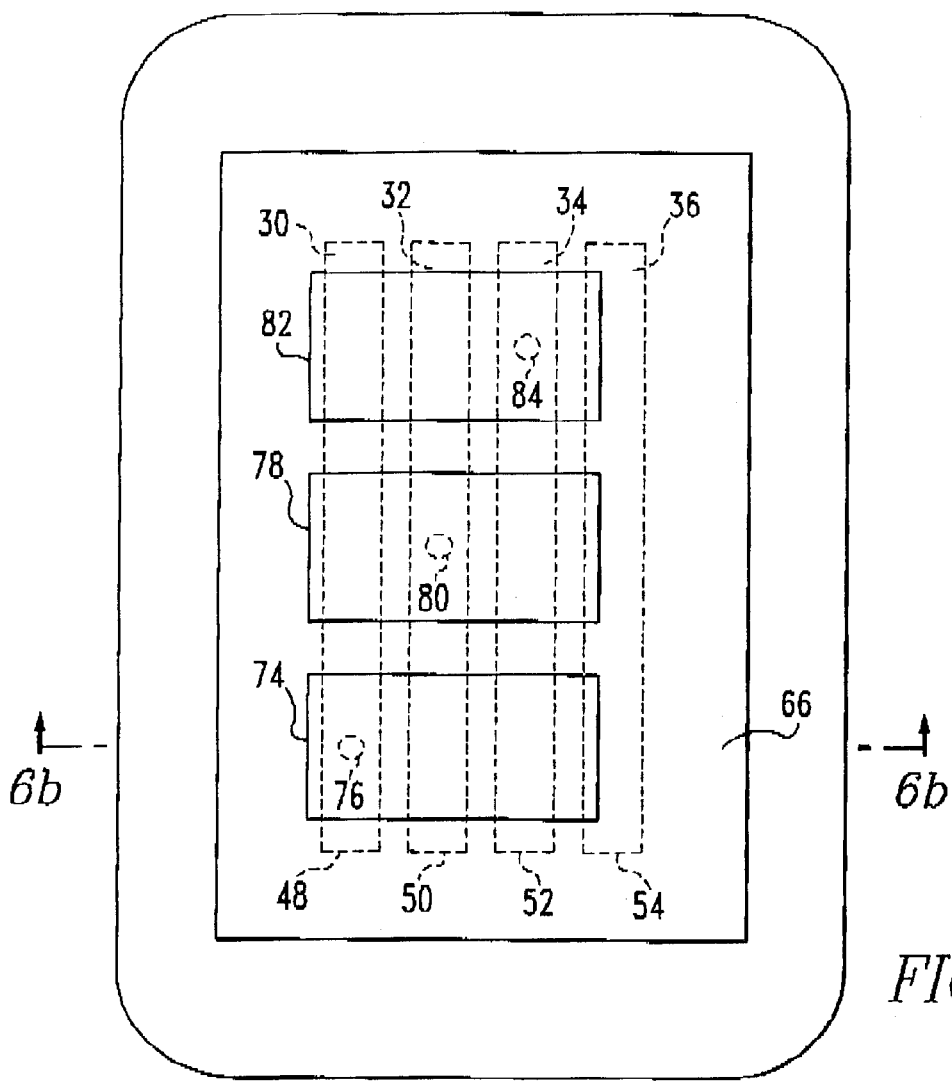
FIG. 6a is a top plan view of the substrate with metal and nitride layers shown in FIGS. 5a and 5b after further processing.
Figure 6B:
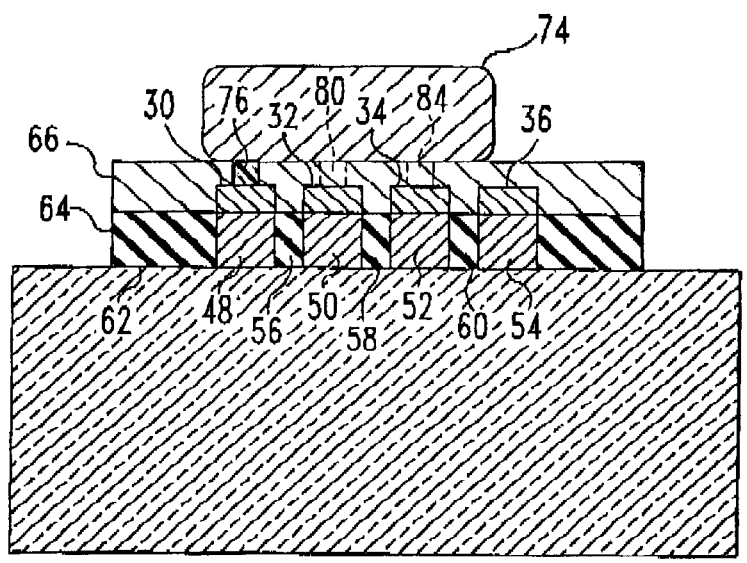

Referring to FIG. 6*a* and 6*b*, the hole 68 is filled with an adhesion metal composition 74 after which an indium bump is superimposed on the nitride layer 66. Hole 70 is filed with an adhesion metal composition to fix indium bump 78 in superimposed relation over nitride layer 66. Hole 76 is filled with adhesion metal composition 82 to fix indium bump 84 in superimposed relation on nitride layer 66.

It will be appreciated at an efficient cost effective means of positioning an indium bump on an opto electronic device has been described.

While the present invention has been described in connection with preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method of fabricating a dense pixel array comprising the steps of:
    (a) printing a photoresist mask and applying said mask to a semiconductor material substrate to form a masked area and an unmasked area on said substrate;
    (b) applying a photoresist material layer to the unmasked area of the substrate, then applying a metal layer over,the photoresist material layer and the substrate, and then applying a solvent to remove the photoresist material layer and said metal layer applied over said photoresist material layer to leave a plurality of metal layers superimposed over the unmasked area of the substrate;
    (c) removing the substrate to a depressed substrate surface between the metal layers formed in step (b) to form a plurality of pixels each having an upper metal layer;
    (d) superimposing an insulative layer over each of the metal layers formed in step (c);
    (e) forming a hole in at least one of the insulative layers formed in step (d) so as to expose the metal layer under said insulative layer; and
    (f) superimposing a metallic feature over the insulative layers on a plurality of the pixels and electrically connecting said metallic feature to one of the metal layers superimposed over one of said pixels over which the metallic feature is superimposed.

2. The method of claim 1 wherein in step (a) pixel size is defined and is from 1.5 microns to 9.75 microns.

3. The method of claim 2 wherein in step (a) pixel separation is from 0.115 micron to 0.75 micron.

4. The method of claim 1 wherein in step (b) the metal is a Au/Ni/Au pixel metal.

5. The method of claim 4 wherein the metal is applied by an electron beam lithography process.

6. The method of claim 1 wherein in step (c) the pixels are formed by a reactive ion etch (RIE) process.

7. The method of claim 1 wherein in step (d) the insulative layer is a nitride layer.

8. The method of claim 7 wherein the nitride layer is comprised of a base nitride layer extending from the base surface of the substrate to the top of the pixel and a top nitride layer superimposed over the base layer and the metal layers on the pixel.

9. The method of claim 1 wherein in step (e) the hole is formed by a nitride etch process.

10. The method of claim 1 wherein in step (f) the metallic feature is an indium bump.

11. The method of claim 1 wherein in step (f) an adhesion metal composition connects the metallic feature and the metal layer supra imposed over one of the pixels.

12. A method of fabricating a dense pixel array comprising the steps of:
    (a) defining the pixel size by printing a photoresist mask and applying said mask to a semiconductor material substrate to form a masked area and an unmasked area on said substrate;
    (b) applying a photoresist material layer to the unmasked area of the substrate, then applying a metal layer over the photoresist material layer and the substrate, and then applying a solvent to remove the photoresist material layer and said metal layer applied over said photoresist material layer to leave a plurality of metal layers superimposed over the unmasked area of the substrate;
    (c) removing the substrate to a depressed substrate surface between the metal layers formed in step (b) to form a plurality of pixels each having an upper metal layer;
    (d) superimposing a nitride insulative layer over each of the metal layers formed in step (c);
    (e) forming a hole in at least one of the nitride insulative layers formed in step (d) so as to expose the metal layer under said nitride insulative layer;
    (f) superimposing an indium bump over the insulative layers on a plurality of the pixels and electrically connecting said indium bump to said one the metal layers superimposed over one of said pixels over which the said indium bump is superimposed.

* * * * *